US006208679B1

(12) United States Patent
Sanchez-Rubio et al.

(10) Patent No.: US 6,208,679 B1
(45) Date of Patent: Mar. 27, 2001

(54) HIGH-POWER MULTI-WAVELENGTH EXTERNAL CAVITY LASER

(75) Inventors: Antonio Sanchez-Rubio, Lexington; Tso Yee Fan, Belmont; Han Quan Le, Newton, all of MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/149,610

(22) Filed: Sep. 8, 1998

(51) Int. Cl.$^7$ ....................................................... H01S 3/08
(52) U.S. Cl. ............................... 372/92; 372/108; 372/98
(58) Field of Search ................................ 372/92, 98, 108, 372/39, 43; 359/130, 124

(56) References Cited

U.S. PATENT DOCUMENTS

| | | | |
|---|---|---|---|
| 4,923,270 | 5/1990 | Carter | 350/96.18 |
| 5,115,444 | 5/1992 | Kirkby et al. | 372/50 |
| 5,163,058 | 11/1992 | Farries et al. | 372/6 |
| 5,351,262 | 9/1994 | Poguntke et al. | 372/102 |
| 5,379,310 | 1/1995 | Papen et al. | 372/23 |
| 5,526,155 | 6/1996 | Knox et al. | 359/124 |

OTHER PUBLICATIONS

M.C. Farries et al., "Tuneable Multiwavelength Semiconductor Laser with Single Fibre Output" *Electronics Letters* 27 (17):1498–1499 (1991).

K.R. Poguntke et al., "Simultaneous Multiple Wavelength Operation of a Multistripe Array Grating Integrated Cavity Laser" *Applied Physics Letters* 62:2024–2026 (1993).

*Primary Examiner*—Leon Scott, Jr.
(74) *Attorney, Agent, or Firm*—Testa, Hurwitz & Thibeault, LLP

(57) ABSTRACT

A high-power external cavity laser source is described. The laser source includes a free space external cavity. At least two multimode optical gain elements are positioned in the cavity. Each gain element generates multimode optical radiation having one of at least a first and a second wavelength and one of at least a first and a second free space optical path, respectively. In another embodiment, at least two optical fiber gain media are positioned in at least two respective free space optical paths and each gain media generates optical radiation having one of at least a first and a second wavelength, respectively. An optical element is positioned in the cavity such that its focal plane is substantially located at the at least two optical gain elements and such that it intercepts the at least two respective free space optical paths. A dispersive element is positioned in the at least two optical paths. A partially reflecting element is also positioned in the at least two optical paths. The partially reflecting element and the gain media together form a free space laser cavity that defines the at least first and second wavelength. In operation, the partially reflecting element transmits an overlapping or coaxial beam comprising radiation having the at least first and second wavelength.

20 Claims, 3 Drawing Sheets

HIGH-POWER MULTI-WAVELENGTH EXTERNAL CAVITY LASER

GOVERNMENT SUPPORT

This invention was made with government support under Contract Number F19628-95-0002 awarded by the U.S. Air Force. The government has certain rights in the invention.

FIELD OF THE INVENTION

The invention relates generally to the field of external cavity laser sources. In particular, the invention relates to efficient high-power or high-brightness, multi-wavelength external cavity laser sources and to methods of generating a high-power or high-brightness multi-wavelength overlapping or coaxial optical beam using an external cavity laser.

BACKGROUND OF THE INVENTION

High-power or high-brightness semiconductor laser sources which have high efficiency are required for a variety of applications including machining, laser pumping and numerous medical procedures. Efficient high brightness semiconductor laser sources are typically achieved by focusing a semiconductor laser beam into an optical fiber having a small etendue (i.e. small product of core diameter and numerical aperture of the fiber).

Prior methods of fiber coupling high-power diode laser arrays, however, require the use of highly multimode optical fiber (i.e. large etendue) and, therefore, have relatively low brightness. For example, one commercial product generates 30 Watts of output power from a multi-mode fiber with a core diameter of about 1 mm and a numerical aperture of 0.12.

Numerous other applications require high-power or high-brightness sources. These applications include communications, solid state laser pumping, imaging, printing, and optical switching. Relatively low-power, multi-wavelength integrated and external cavity lasers have been constructed using dispersive elements.

U.S. Pat. No. 5,351,262 to Poguntke et al. describes a multi-wavelength laser having an integrated cavity that is formed on a single substrate. The laser includes a plurality of individually selectable active waveguides, a diffraction grating, and a passive output waveguide. A resonant cavity is formed between the selected active stripe, the diffraction grating, and the passive output waveguide. The geometry of the resonant cavity determines the lasing wavelengths of each of the plurality of active waveguides. The Poguntke laser can only be used to generate relatively low powers because it is integrated on a monolithic substrate and thus has limited heat dissipation.

Farries, et al., *Tunable Multiwavelength Semiconductor Laser with Single Fibre Output*, Electronic Letters, Vol. 27, No. 17, Aug. 15, 1991, describes a low-power multi-wavelength external cavity laser that uses a diffraction grating. The external cavity comprises a monolithic semiconductor laser array, a diffraction grating, and a single mode fiber loop mirror. The loop mirror includes a 50:50 coupler with two output ports that are fusion spliced to form a Sagnac interferometer.

Because the Farries laser is designed for fiber optic communication systems, it comprises a single mode semiconductor laser array and, therefore, it can only be used to generate relatively low powers. In Farries, the element separation in the semiconductor laser array is only ten microns. The resulting output power into the fiber is only approximately 0.5 mW per element. In addition, because the Farries laser couples the light from the monolithic semiconductor laser array into a single mode fiber, it is relatively inefficient.

U.S. Pat. No. 5,115,444 to Kirkby et al. describes a multi-wavelength external cavity and integrated cavity laser that uses a dispersive element. A set of optical cavities having different frequency bands is formed from a set of individually addressable semiconductor laser amplifiers, each having a single reflecting facet. The cavity includes a common dispersive element and a common semiconductor amplifier having a partially reflecting facet. The Kirkby laser can only be used to generate relatively low powers. The Kirkby integrated cavity laser is formed on a monolithic substrate and thus has limited heat dissipation. The Kirkby external cavity laser uses a common semiconductor amplifier through which all optical beams in the cavity must propagate. Because the common amplifier also has limited heat dissipation, the Kirkby external cavity laser can only generate relatively low power.

U.S. Pat. No. 5,379,310 to Papen et al. describes an external cavity multi-wavelength laser that uses a dispersive element. A cavity is formed from a plurality of semiconductor lasers, a dispersive element and a reflective element. The plurality of semiconductor lasers generates a plurality of optical beams which are deflected by the dispersive element onto the reflective element. The combination of the dispersive element and the curved surface imposes a different resonance condition on each semiconductor laser thereby resulting in each laser lasing at a different wavelength. The Papen laser generates a plurality of parallel output beams; each beam having a different wavelength. The Papen laser is designed for relatively low power applications such as communication systems, data storage, and spectroscopy. Because the Papen laser generates a parallel (not overlapping or coaxial) output beam, it has relatively low brightness.

SUMMARY OF THE INVENTION

It is therefore a principal object of this invention to provide a high-power or high-brightness, multi-wavelength semiconductor or fiber laser source that generates an overlapping or coaxial beam. It is another principle object of this invention to couple such a source into an optical fiber.

A principal discovery of the present invention is that a high-power or high-brightness, multi-wavelength external cavity laser that generates an overlapping or coaxial beam can be constructed with an optical fiber (single mode or multimode) or a multi-mode semiconductor gain media, a wavelength dispersive element, and a partially reflecting element.

Accordingly, in one embodiment, the present invention features a high-power, external cavity laser source. At least two multimode optical gain media are positioned in the cavity. Each gain element generates multimode optical radiation having one of at least a first and a second wavelength and one of at least a first and a second free space optical path, respectively. Each gain element may generate at least substantially 0.5 Watt of multimode optical radiation.

An optical element is positioned in the cavity such that its focal plane is approximately located at the at least two optical gain media and such that it intercepts the at least two respective free space optical paths. The optical element may comprise a refractive or a reflective element. A dispersive element is positioned in the at least two optical paths. In one embodiment, the dispersive element comprises a grating. In another embodiment, the optical element and the dispersive element comprise a single optical element such as a Rowland-circle grating.

A partially reflecting element is also positioned in the at least two optical paths. In one embodiment, the partially reflecting element comprises an end face of an optical fiber. The partially reflecting element and the gain media together form a free space laser cavity that defines the at least first and second wavelength. In operation, the partially reflecting element transmits an overlapping or coaxial beam comprising radiation having the at least first and second wavelength.

The present invention also features a multi-wavelength, free space external cavity laser source. At least two optical fiber gain media are positioned in at least two respective free space optical paths. Each gain media generates optical radiation having one of at least a first and a second wavelength, respectively. Each of the at least two optical fiber gain media may generate at least substantially 0.5 Watt of optical radiation.

An optical element is positioned in the cavity such that its focal plane is substantially located at the at least two optical gain media and such that it intercepts the at least two respective free space optical paths. The optical element may comprise a refractive or a reflective element. A dispersive element is positioned in the at least two optical paths. The dispersive element may comprise a grating. In one embodiment, the optical element and the dispersive element comprise a single optical element such as a Rowland-circle spectrometer grating.

A partially reflecting element is also positioned in the at least two optical paths. In one embodiment, the partially reflecting element comprises an end face of an optical fiber. The partially reflecting element and the gain media together form a free space laser cavity that defines the at least first and second wavelength. In operation, the partially reflecting element transmits an overlapping or coaxial beam comprising radiation having the at least first and second wavelength.

BRIEF DESCRIPTION OF THE DRAWINGS

This invention is described with particularity in the appended claims. The above and further advantages of this invention may be better understood by referring to the following description taken in conjunction with the accompanying drawings, in which:

DETAILED DESCRIPTION

Figure 1:
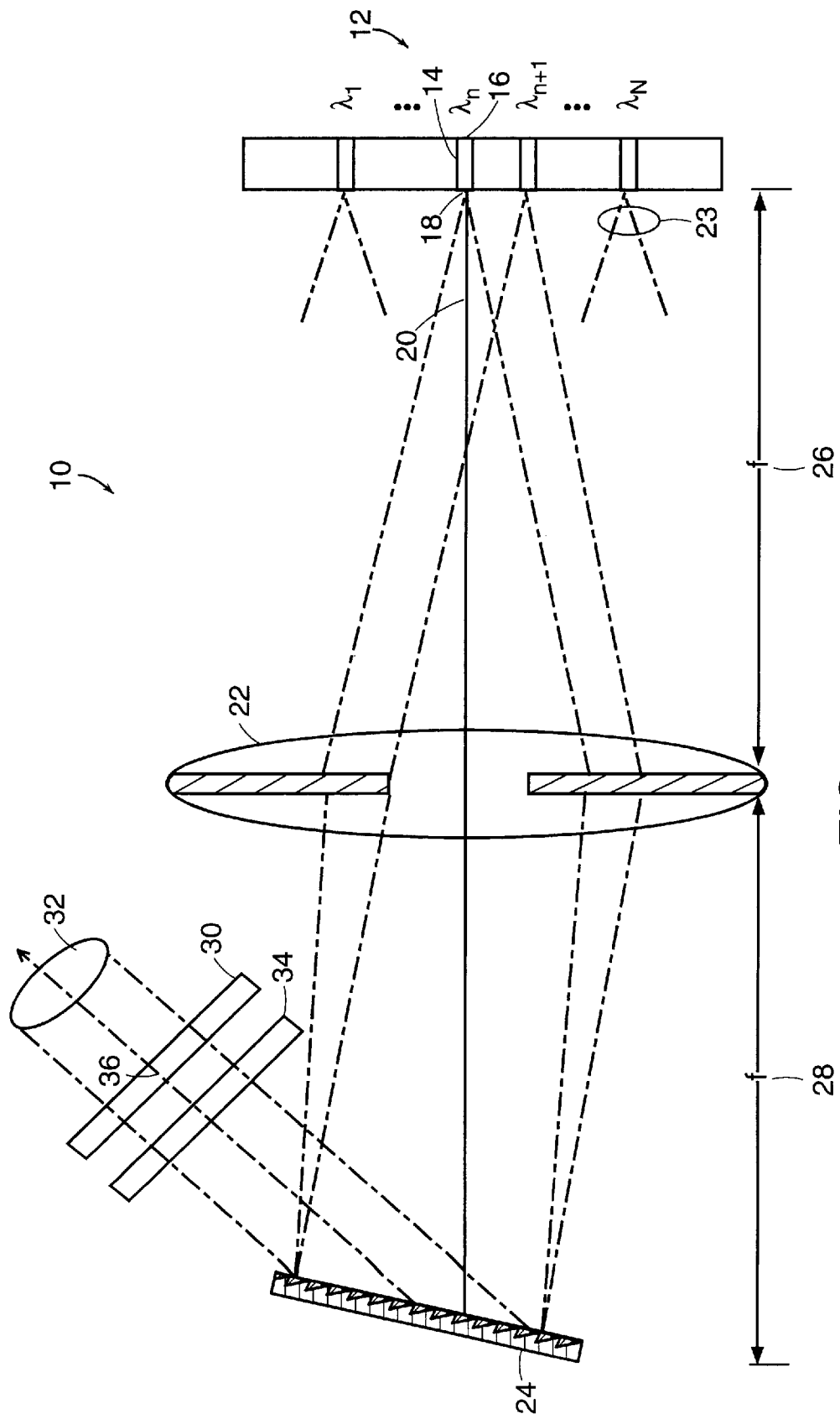
FIG. 1 illustrates a schematic diagram of an embodiment of a multi-wavelength external cavity laser according to the present invention.

FIG. 1 illustrates a schematic diagram of an embodiment of a multi-wavelength external cavity laser 10 according to the present invention. The laser 10 includes a plurality of optical gain media 12. The gain media 12 may be positioned on equal or unequal center-to-center spacing. Positioning the gain media 12 on unequal spacing may reduce cross talk between the gain media 12. Each of the gain media may be substantially the same or different gain media. Any optical gain media may be used. The gain media 12 must, however, have sufficient gain and sufficient gain bandwidth to overcome optical losses at the desired lasing wavelengths.

In one embodiment, the gain media 12 comprise a linear array of multi-mode semiconductor laser amplifiers having stripes 14 of active gain media. In another embodiment, the gain media 12 comprise a plurality of discrete multi-mode semiconductor amplifiers. In yet another embodiment, the gain media 12 comprise a plurality of fiber amplifiers.

Each gain media 12 has a reflecting rear face 16 and a substantially antireflective front face 18. In one embodiment, the rear face 16 is substantially totally reflecting. Each of the gain media 12 emit a beam of radiation in different optical paths 20. An optical element, such as a collimating lens 22, is positioned in the optical paths 20 of the beams. In one embodiment, additional collimating lenses 23 are positioned adjacent to the front face 18 of each gain media 12. In one embodiment, the optical element comprises a curved mirror.

A dispersive element, such as a diffraction grating 24, is also positioned in the optical paths 20. In one embodiment, the lens 22 is positioned at substantially a focal length 26 away from the gain media 12 and the grating 24 is positioned at substantially a focal length 28 away from the lens 22.

A partially reflective element 30, such as a partial mirror 30, is positioned in the optical paths 20 so that it reflects the optical beams at near normal incidence. The partial mirror 30 reflects a portion of the beams emitted by the gain media 12 back into the optical paths 20. The partial mirror 30 also transmits a portion of the optical beams emitted by the gain media 12 out of the laser 10 as an overlapping or coaxial output beam 32.

In one embodiment, a spatial filter 34 is positioned between the grating 24 and the partial mirror 30. The spatial filter 34 may comprise a lens positioned at substantially a focal length from an aperture 36 in the partial mirror 30. Typically the aperture 36 is partially reflective and is dimensioned such that it is substantially the dimensions of the image of one of the gain media 12. The surface of the partial mirror surrounding the aperture 36 may be absorbing, scattering or transmissive. In operation, the spatial filter 34 passes only those rays that are at near normal incidence to the spatial filter 34. This eliminates cross talk between the gain media 12.

A resonator is formed by the reflecting surface of the rear face 16 of each of the gain media 12 and the partial mirror 30. The optical paths 20 of the laser 10 all pass through lens 22 and are all dispersed by grating 24. That is, the optical paths 20 all share lens 22 and grating 24 but pass through only one of the plurality of semiconductor gain media 12. The overlapping or coaxial output beam 32 propagates normal to the partially reflecting mirror.

A method of generating high-power optical radiation using the external cavity laser source of the present invention includes providing a free space external cavity. The cavity includes at least two multimode optical gain media at one end of the cavity and a partially reflecting element at the other end of the cavity. An optical element and a dispersive element are positioned in the optical paths of the cavity.

The gain media 12 are pumped with energy which is typically provided by electrical current or optical radiation. The gain media each generate optical beams having one of at least a first and a second wavelength and one of at least a first and a second free space optical path, respectively. Each of the gain media may generate at least 0.5 Watt of multimode optical radiation.

The pumped gain media and the partially reflecting element together form an ensemble of individual external cavity lasers, each with its own gain media and optical path. An output beam comprising radiation having the at least first and second wavelength is transmitted through the partially reflecting element. The output beam is overlapping or coaxial in shape because all of the optical beams travel through the optical element such that their paths intercept at the location of the dispersive element and have a common path on the partial mirror 30 side of the dispersive element.

Since each of these individual external cavity lasers has its beam incident on the dispersive element at a different angle, each of the external cavity lasers has a different optical path and, therefore, each external cavity laser lases at a different wavelength. The wavelengths generated by each laser are a function of the center-to-center spacing of the gain media and the properties of the dispersive element. The center-to-center spacing of the gain media may be constant or variable. The wavelengths are tunable. One method of tuning the wavelengths of the lasers is to slightly tilt the partially reflecting element. This changes the angle of incidence of the optical beams on the dispersive element and thus changes the optical path lengths.

Another method of tuning the wavelengths of the external cavity lasers is to translate the gain element sideways (up and down in figure). This also changes the angle of incidence of the optical beams on the grating and thus changes the optical path length. Tuning the wavelengths of lasers by translating the gain element sideways is advantageous because translating the gain media does not translate the output beam.

The tuning range depends on the gain bandwidth of the gain media and the reflectivity presented by the partially reflecting element. The number of gain media and their location can be chosen so as to generate simultaneously or sequentially any set of wavelengths within the gain width of the gain media.

Figure 2:
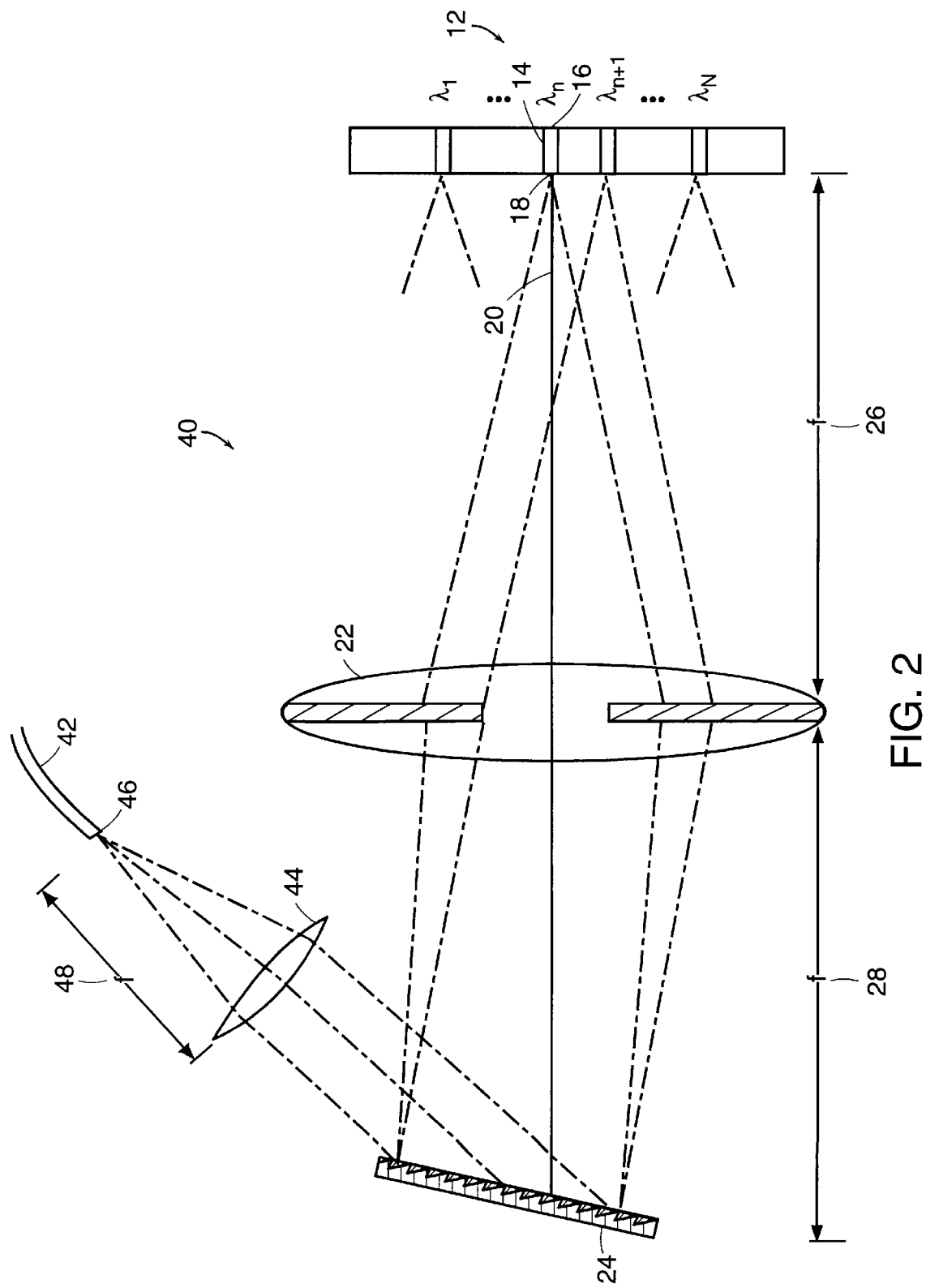
FIG. 2 illustrates a schematic diagram of an embodiment of a multi-wavelength external cavity laser according to the present invention that couples a high-power semiconductor laser source into an optical fiber.

FIG. 2 illustrates a schematic diagram of an embodiment of a multi-wavelength external cavity laser according to the present invention that couples a high-power semiconductor laser array into an optical fiber 42. The laser 40 of FIG. 2 is similar to the laser 10 of FIG. 1. The partial mirror 30 of FIG. 1 is replaced by a lens 44 which focuses the beams generated by gain media 12 onto a partially reflecting end face 46 of the optical fiber 42. A resonator is formed by the reflecting surface of the rear face 16 of each of the gain media 12 and the partially reflective end face 46 of the optical fiber 42. The optical fiber 42 is positioned a distance that is substantially equal to a focal length 48 away from the lens 44. The lens 44 is designed to focus the output beam into an angle that does not exceed the numerical aperture of the fiber 42.

Figure 3:
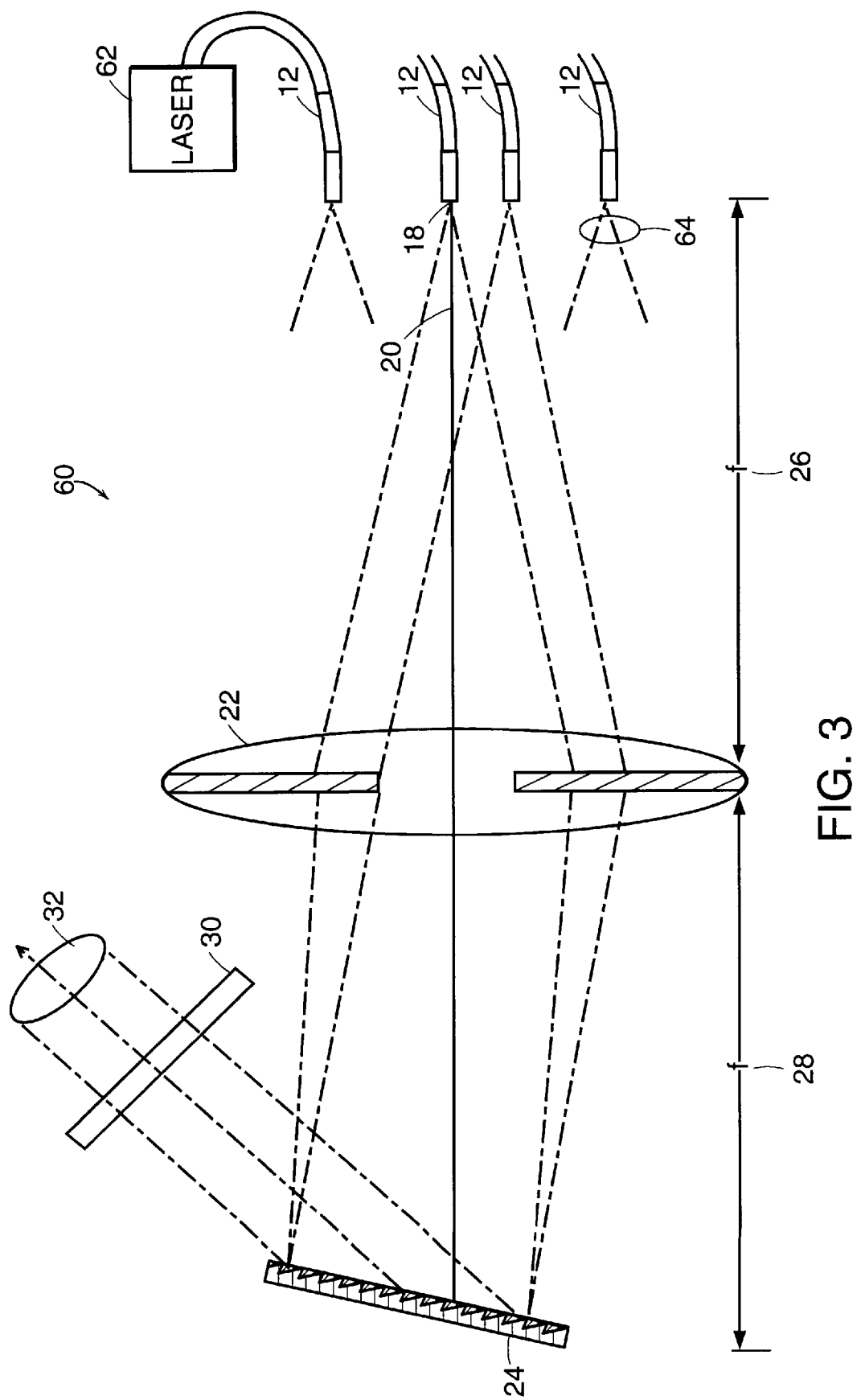
FIG. 3 illustrates a schematic diagram of an embodiment of a multi-wavelength external cavity laser according to the present invention that uses fiber amplifier gain media.

FIG. 3 illustrates a schematic diagram of an embodiment of a multi-wavelength external cavity laser according to the present invention that uses fiber amplifier gain media 12. The laser 60 of FIG. 3 is similar to the laser 10 of FIG. 1. The gain media 12 comprise a plurality of fiber amplifiers. In operation, the fiber amplifiers are optically pumped by a pump laser 62. In one embodiment, focusing lenses 64 are positioned adjacent to the output of each of the fibers.

The present invention teaches a high-power or high-brightness, multi-wavelength semiconductor or fiber laser that generates an overlapping or coaxial beam that can be coupled into an optical fiber. The laser can be constructed with a multi-mode semiconductor or fiber gain media, a wavelength dispersive element, and a partially reflecting element. Prior art multi-wavelength semiconductor laser have limited heat dissipation and typically use relatively low power single mode lasers and thus can not generate high-power or high-brightness radiation.

EQUIVALENTS

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A high-power external cavity laser source comprising:
 a) a free space external cavity comprising:
  i) a semiconductor laser array with at least two multi-mode optical gain elements, the at least two multi-mode optical gain elements each generating multi-mode optical radiation having one of at least a first and a second wavelength and one of at least a first and a second free space optical path, respectively;
  ii) an optical element having a focal plane, the optical element positioned to substantially place the focal plane at the at least two optical gain elements and to intercept the at least two respective free space optical paths;
  iii) a movable dispersive element positioned in the at least two optical paths, said movable dispersive gain element being movable to tune said external cavity laser; and
  iv) a partially reflecting element positioned in the at least two optical paths, the partially reflecting element and the gain elements together forming said free space laser cavity that produces the at least first and second wavelengths,
  the partially reflecting element further transmitting an overlapping beam comprising radiation having the at least first and second wavelengths.

2. The laser of claim 1 wherein the optical element and the dispersive element comprise a single optical element.

3. The laser of claim 1 wherein the dispersive element is positioned substantially at the focal plane of the optical element.

4. The laser of claim 1 wherein the dispersive element comprises a grating.

5. The laser of claim 1 wherein the optical element comprises a refractive or a reflective element.

6. The laser of claim 1 wherein the partially reflecting element comprises an end face of a multimode optical fiber.

7. The laser of claim 1 wherein the at least two multimode optical gain elements each generates at least 0.5 Watt of multimode optical radiation.

8. The laser of claim 1 wherein overlapping beam comprises a coaxial beam.

9. A multi-wavelength free space external cavity laser source comprising:
 a) a free space external cavity comprising:
  i) at least two optical fiber gain media positioned in at least two respective free space optical paths, the at least two optical fiber gain media each generating optical radiation having one of at least a first and a second wavelength, respectively;
  ii) an optical element having a focal plane, the optical element positioned to substantially place the focal plane at the at least two optical gain media and to intercept the at least two respective free space optical paths;
  iii) a movable dispersive element positioned in the at least two optical paths, said movable dispersive element being movable to tune said multi-wavelength free space external cavity laser source; and iv) a partially reflecting element positioned in the at least two optical paths, the partially reflecting element and the gain media together forming said free space laser cavity that produces the at least first and second wavelengths, the partially reflecting element further transmitting an overlapping beam comprising radiation having the at least first and second wavelengths.

10. The laser of claim 9 wherein the optical element and the dispersive element comprise a single optical element.

11. The laser of claim 9 wherein the dispersive element is positioned substantially at the focal plane of the optical element.

12. The laser of claim 9 wherein the dispersive element comprises a grating.

13. The laser of claim 9 wherein the optical element comprises a refractive or a reflective element.

14. The laser of claim 9 wherein the partially reflecting element comprises an end face of an optical fiber.

15. The laser of claim 9 wherein the at least two optical fiber gain media each generate at least 0.5 Watt of optical radiation.

16. The laser of claim 9 wherein overlapping beam comprises a coaxial beam.

17. The method of claim 16 wherein each of the at least two multimode optical gain media generate at least 0.5 Watt of multimode optical radiation.

18. The method of claim 16 wherein the step of transmitting an overlapping beam comprises transmitting a coaxial beam.

19. A method of generating high-power optical radiation using an external cavity laser source, the method comprising:

a) providing a free space external cavity comprising:
  i) at least two optical fiber gain media, the at least two optical fiber gain media each generating optical radiation having one of at least a first and a second wavelength and one of at least a first and a second free space optical path, respectively;
  ii) an optical element having a focal plane, the optical element positioned to substantially place the focal plane at the at least two optical gain elements and to intercept the at least two respective free space optical paths;
  iii) a movable dispersive element positioned in the at least two optical paths, said movable dispersive element being movable to tune said external cavity laser source; and
  iv) a partially reflecting element positioned in the at least two optical paths, the partially reflecting element and the gain media together forming a free space laser cavity that produces the at least first and second wavelengths; and b) transmitting an overlapping beam comprising radiation having the at least first and second wavelengths through the partially reflecting element.

20. The method of claim 19 wherein the step of transmitting an overlapping beam comprises transmitting a coaxial beam.

* * * * *